United States Patent
Wang et al.

(10) Patent No.: US 8,809,205 B2
(45) Date of Patent: Aug. 19, 2014

(54) SEQUENTIAL ATOMIC LAYER DEPOSITION OF ELECTRODES AND RESISTIVE SWITCHING COMPONENTS

(71) Applicants: Intermolecular, Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/721,549

(22) Filed: Dec. 20, 2012

(65) Prior Publication Data
US 2014/0175354 A1    Jun. 26, 2014

(51) Int. Cl.
*H01L 21/469* (2006.01)

(52) U.S. Cl.
USPC ............. 438/785; 438/104; 257/E21.68

(58) Field of Classification Search
USPC ............. 438/785, 104; 257/E21.68, 2
See application file for complete search history.

(56) References Cited

U.S. PATENT DOCUMENTS

| | | | |
|---|---|---|---|
| 8,008,096 B2 * | 8/2011 | Fuchigami et al. ............ | 438/3 |
| 2010/0123117 A1 | 5/2010 | Sun et al. | |
| 2010/0285633 A1 | 11/2010 | Sun | |
| 2011/0272660 A1 * | 11/2011 | Wells ............................. | 257/4 |
| 2013/0023105 A1 | 1/2013 | Pramanik | |

OTHER PUBLICATIONS

Chen, P., et al; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.

Kim, S., et al.; Dielectric and Electrode Thin Films for StackCell Structured DRAM Capacitors with Sub 50nm Design Rules; Sep. 19, 2007; EMRS; Warsaw University of Technology.

Seo, S., et al.; Electrode dependence of resistance switching in polycrystalline NiO films; Jan. 1, 2005; American Institute of Physics; Applied Physics Letters 87 263507 2005.

Becker, J., et al.; Atomic Layer Deposition of Insulating Hafnium and Zirconium Nitrides; Jan. 1, 2004; Harvard, College (US) ; Cherm. Mater pp. 34973501.

(Continued)

*Primary Examiner* — Zandra Smith
*Assistant Examiner* — Paul Patton

(57) ABSTRACT

Provided are methods of forming nonvolatile memory elements using atomic layer deposition techniques, in which at least two different layers of a memory element are deposited sequentially and without breaking vacuum in a deposition chamber. This approach may be used to prevent oxidation of various materials used for electrodes without a need for separate oxygen barrier layers. A combination of signal lines and resistive switching layers may be used to cap the electrodes and to minimize their oxidation. As such, fewer layers are needed in a memory element. Furthermore, atomic layer deposition allows more precise control of electrode thicknesses. In some embodiments, a thickness of an electrode may be less than 50 Angstroms. Overall, atomic layer deposition of electrodes and resistive switching layers lead to smaller thicknesses of entire memory elements making them more suitable for low aspect ratio features of advanced nodes.

19 Claims, 5 Drawing Sheets

(56) References Cited

OTHER PUBLICATIONS

Kim, H.; Atomic Layer Depositon of Metal and Nitrade Thin Films Current Research Efforts and Applications for Semiconductor Device Processing; Nov. 3, 2003; American Vacuum Society; J. Vac. Sci. Teechnol. 22312261.

Westlinder, J., et al.; On the Thermal Stability of Atomic Layer Deposited TiN as Gate Electrode in MOS Devices; Sep. 1, 2003; Uppsala Universitet; IEEE Electron Device Letters vol. 24 No. 9 pp. 550552.

Chen, Y., et al.; HydrogenInduced Resistive Switching in TiNALD Hf2PEALD TiN RRAM Device; Apr. 1, 2012; IEEE; IEEE Electron Device Letters vol. 33 No. 4 pp. 483485.

\* cited by examiner

SEQUENTIAL ATOMIC LAYER DEPOSITION OF ELECTRODES AND RESISTIVE SWITCHING COMPONENTS

TECHNICAL FIELD

The present invention relates generally to semiconductor processing and more specifically to sequential atomic layer deposition of electrodes and resistive switching layers.

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., USB flash drives). Nonvolatile memory is becoming more popular because of its small size and high density, low power consumption, fast read and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are methods of forming nonvolatile memory elements using atomic layer deposition techniques, in which at least two different layers of a memory element are deposited sequentially and without breaking vacuum in a deposition chamber. Specifically, an electrode layer and a resistive switching layer may be formed in such manner. The resistive switching layer may include hafnium oxide. This approach may be used to prevent oxidation of various materials used for electrodes without a need for separate oxygen barriers layers. A combination of signal lines and resistive switching layers may be used to cap the electrodes and to minimize their oxidation. As such, fewer layers are needed in a memory element. Furthermore, atomic layer deposition allows more precise control of electrode thicknesses. In some embodiments, a thickness of an electrode may be less than 50 Angstroms. Overall, atomic layer deposition of electrodes and resistive switching layers lead to smaller thicknesses of entire memory elements making them more suitable for low aspect ratio features of advanced nodes.

In some embodiments, a method of forming a nonvolatile memory element involves forming a first layer using atomic layer deposition in a processing chamber followed by forming a second layer also using atomic layer deposition in the same processing chamber. The two layers are formed without breaking without vacuum in the processing chamber during and between these two operations. As such, the first layer is not exposed to any environment other than the processing environments used to form the first and second layers. This control may prevent oxidation and other kinds of contamination of the first layer as the second layer effectively acts as a protective layer after its formation. The first layer may be operable as a bottom electrode of the memory element, while the second layer may be operable as a resistive switching layer. In some embodiments, the first layer has a thickness of less than 50 Angstroms.

The first layer may be formed over a signal line. In this case, the signal line and the second layer protect the first layer from oxidation from underlying layers. As such, after the second layer is formed, the memory element (which may be partially fabricated at this stage) may be exposed to oxygen containing environments without risk of oxidizing the first layer. In some embodiments, the first layer includes one or more of tantalum nitride, titanium nitride, and tungsten nitride. Overall, the first layer may include a number of secondary nitrides, such as TaN, TiN, WN, and MoN, and/or ternary nitrides, such as TaSiN, TiSiN, WSiN, MoSiN or TaAlN, TiAlN, WAlN, and MoAlN.

In some embodiments, the method may also involve forming a third layer using atomic layer deposition in the same or another processing chamber. The third layer may be operable as a second electrode and be formed over the second layer, e.g., directly interfacing the second layer. The method may continue with forming a fourth layer over the third layer without breaking vacuum in the processing chamber between forming the third and fourth layers. The fourth layer may be operable as a protective layer and preventing oxidation of the third layer. The fourth layer may be formed using any deposition technique, such as atomic layer deposition, physical vapor deposition, and chemical vapor deposition.

In some embodiments, the fourth layer is operable as a signal line. In other words, in addition to protecting the third layer from oxidation, the fourth layer may also conduct electrical currents between the memory element and other components provided outside of the memory elements. In some embodiments, a combined thickness of the first, second, and third layers is less than about 300 Angstroms. A smaller thickness may be needed to fit the memory element into low aspect ratio features (e.g., less than 3x) of advanced nodes (e.g., 10 nanometers).

In some embodiments, the processing chamber used for deposition of the third layer is different from the processing chamber used for deposition of the first and second layers. In this situation, the second layer may be exposed to the ambient environment prior to forming the third layer and the second layer protects the first layer from oxygen in the ambient environment.

In some embodiments, the processing chamber used for deposition of the third layer is the same as the processing chamber used for deposition of the first and second layers. In this case, forming the third layer over the second layer may be performed without breaking vacuum in the processing chamber between forming the second layer and forming the third layer. In some embodiments, composition of the third layer is substantially the same as composition of the first layer. The fourth layer may be made of copper or other suitable materials.

In some embodiments, forming the first layer involves delivering one or more of a tantalum containing precursor, titanium containing precursor, or tungsten containing precursor. Some examples include tantalum chloride, tantalum bromide, titanium chloride, titanium iodide, tungsten fluoride, tetrakis(dimethylamino)titanium(TDMAT), tetrakis(ethylmethylamino)titanium (TEMAT), tris(diethylamino)(tert-butylimido)tantalum (TBTDET), and pentakis (ethylmethylamido) tantalum (PEMAT) into first processing chamber. Other examples are listed below. Forming the second layer may involve a series of operations, such as introducing a first precursor into the processing chamber to form a first processing layer, purging the first precursor from the processing chamber, and introducing one or more of an oxygen containing reactive agent and nitrogen containing reactive agent into the processing chamber to convert the first processing layer into the second layer. The first precursor includes one or more of a hafnium containing precursor and aluminum containing precursor, various examples of which are listed below. The oxygen containing reactive agent may include one or more of water, isopropyl alcohol, oxygen, and ozone. The first processing layer may be a partially saturated layer. Without being restricted to any particular theory, it is believed that partial saturation may help to introduce defects into the resistive switching layer during its formation. In some embodiments, the process also involves transferring oxygen from the second layer into the first layer by, for example, annealing. The first layer may directly interface the second layer.

Provided also is a nonvolatile memory element including a first layer operable as a first electrode and formed using atomic layer deposition. The first layer may be substantially free of oxygen, e.g., the oxygen concentration in the first layer may be less than about 1 atomic percent. The first layer may have a thickness of less than 50 Angstroms. The nonvolatile memory element may also include a second layer operable as a resistive switching layer and directly interfacing the first layer. The second layer is also formed using atomic layer deposition.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

Figure 1A:
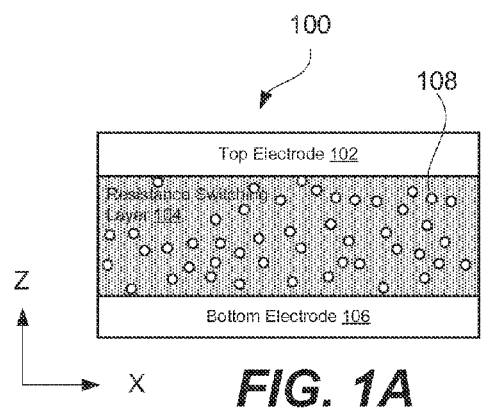
FIGS. 1A and 1B illustrate schematic representations of a nonvolatile memory element in its high resistive state (HRS) and low resistive state (LRS), in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A nonvolatile memory element exhibiting resistive switching characteristics generally includes multiple layers formed into a stack. The structure of this stack is sometimes described as a Metal-Insulator-Metal (MIM). Specifically, the stack includes two conductive layers operating as electrodes. These layers are identified as "M" and may include metals and/or other conductive materials. The stack also includes an insulator layer provided in between the electrode. This layer is indentified as "I" in the above naming convention. The insulator layer exhibits resistive changing properties characterized by different resistive states of the material forming this layer. These resistive states may be used to represent one or more bits of information.

The insulator layer changes its resistive state by applying a certain voltage (e.g., a set voltage and reset voltage) to this layer as further explained below. The applied voltage causes some localized heating within the insulator layer and/or at its interfaces with other components, such as the electrodes. Without being restricted to any particular theory, it is believed that a combination of these applied voltages and localized heating causes formation and breakage of various conductive paths within the insulator layer and/or at its interfaces. Various models of conductive paths and resistive switching are further explained below.

At least one electrode of the resistive switching element (sometimes both) is a reactive electrode, which means that some material is exchanged between this electrode and the resistive switching layer. When metal oxides are used to form resistive switching layers, the corresponding electrodes are often formed from oxygen sensitive materials. These materials can easily take and release oxygen during resistive switching operations of the memory element. Some examples of reactive electrodes that may be used in resistive switching memory elements include titanium nitride, tantalum nitride, and tungsten nitride.

Processing oxygen sensitive materials can be challenging since these materials need to be protected when the partially fabricated memory elements are exposed to the ambient or any other environment containing oxygen. Oxidation of electrodes may negatively impact the resistive switching characteristics of the nonvolatile memory element as different amounts of oxygen may be present in the electrode than needed. Furthermore, distribution of oxygen created by oxidation of the electrode may be impact the resistive switching.

Oxidation of oxygen sensitive electrodes may be prevented by forming protective layers over the electrodes prior their exposure to oxygen containing environment. Some examples of protective layers include reactive metals (e.g., W or Ta). Such protective layers may be formed using PVD, such as DC sputtering. The protective layers can be deposited over oxygen sensitive electrodes without any vacuum break. The thickness of the protective layers can be between about 100 Angstroms to 500 Angstroms. However, adding these protective layers increases the thickness of the memory element.

The thickness generally needs to be kept to the minimum for processing integration. For example, low aspect ratio features (e.g., 3×) may be used to achieve reliable etching performance during memory array integration. With the size of an advanced node being, e.g., 10 nanometers, the total stack thickness may only be 30 nanometers, in this particular example. Of course, other aspect ratios and node sizes can be used leading to different total stack thickness requirements.

Furthermore, electrodes of resistive memory elements are conventionally deposited using physical vapor deposition techniques. PVD generally yields electrodes that are at least 50 Angstroms thick and often substantially thicker. PVD is not suitable for depositing thinner electrodes because of its inherent process control limitations. For example, forming electrodes using PVD techniques typically involve DC or pulsed DC with a power range of 100 W to 300 W. This leads to relatively high deposition rate, often as high as 30-60 Angstroms per minute. As such, a reasonably continuous film formed using PVD needs to be at least 50 Angstroms thick. Otherwise, the film has pin-holes and is not a continuous layer and does not function as an electrode effectively.

Provided are methods of forming nonvolatile memory elements using ALD techniques, in which at least two different layers of a memory element are deposited sequentially and without breaking the vacuum in the deposition chamber. ALD allows precise control over the thickness and composition of the formed electrode layers. This deposition technique is suitable for depositing ultrathin structures. For example, a growth rate of about 0.25 Angstroms to about 2.00 Angstroms per cycle can be realized. A number of cycles are repeated to achieve the total thickness of the electrode. Furthermore, multiple different components of the same memory element may be deposited using ALD in the same deposition chamber without breaking the vacuum. This environment control feature helps protect an initially formed layer with a subsequently formed layer that effectively caps the initial layer. For example, a process may start with deposition of a bottom electrode containing a moisture sensitive material followed by deposition of a resistive switching layer in the same chamber and without breaking vacuum. As such, the resistive switching layer protects the bottom electrode from oxidizing environments and eliminates a need for separate capping layers. Various combinations of signal lines and resistive switching layers may be used to protect electrodes. Overall, these features may lead to a smaller thickness of the overall stack that includes two electrodes and a resistive switching layer.

ALD also provides control of an interface formed between the electrode and resistive switching layer. As further discussed below, this interface is used to transfer defects (e.g., oxygen) between the electrode and resistive switching layer and thereby impacts resistive switching characteristics. The interface has to be continuous. It has been found that addition of capping layers often results in less desirable interfaces causing less control over resistive switching elements.

Examples of Nonvolatile Memory Elements and their Switching Mechanisms

A brief description of nonvolatile resistive memory elements is provided for context and better understanding of various features associated with sequential deposition of electrodes and resistive switching layers. A memory element includes a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

A basic building unit of a memory device is a stack having a capacitor like structure. A nonvolatile memory element includes two electrodes and a dielectric material positioned in between these two electrodes. FIG. 1A illustrates a schematic representation of nonvolatile memory element 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. Nonvolatile memory element 100 may also include other components, such as an embedded resistor, diode, and other components. Nonvolatile memory element 100 is sometimes referred to as a memory element or a memory unit.

Resistance switching layer 104 which may be initially formed from a dielectric material and later can be made to conduct through one or more filaments or conduction paths formed by applying a set-? voltage. To provide this resistive switching functionality, resistance switching layer 104 includes a concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for nonvolatile memory elements operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Figure 1B:
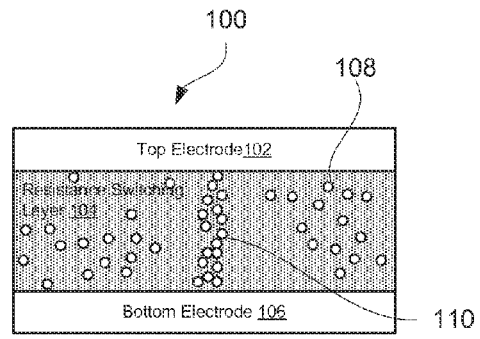

Without being restricted to any particular theory, it is believed that defects 108 can be reoriented within resistance switching layer 104 to form filaments or conduction paths as, for example, schematically shown in FIG. 1B as element 110. This reorientation of defects 108 occurs when a voltage for this type of resistance switching layer 104 is applied to electrodes 102 and 106. Sometimes, reorientation of defects 108 is referred to as filling the traps by applying a set voltage (and forming one or more filaments or conduction paths) and emptying the traps by applying a reset voltage (and breaking the previously formed filaments or conduction paths).

Defects 108 can be introduced into resistance switching layer 104 during or after its fabrication. For example, a concentration of oxygen deficiencies can be introduced into metal oxides during their deposition or during subsequent annealing.

Figure 2:
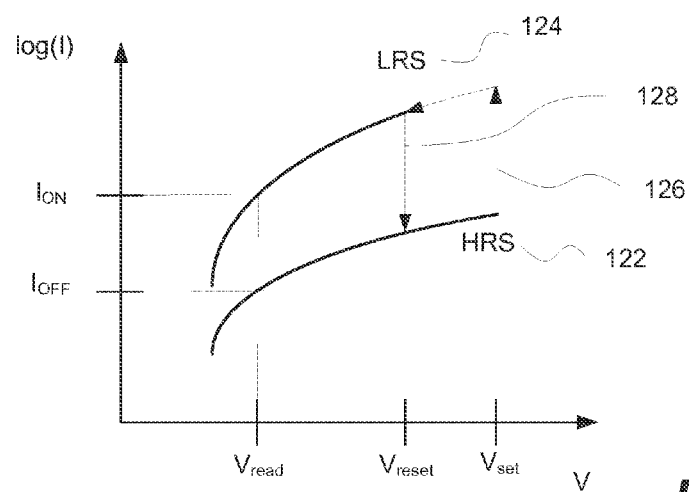
FIG. 2 illustrates a plot of a current passing through a nonvolatile memory element as a function of a voltage applied to the memory element, in accordance with some embodiments.

Operation of nonvolatile memory element 100 will now be briefly described with reference to FIG. 2 illustrating a logarithmic plot of a current passing through a nonvolatile memory element as a function of a voltage applied to the electrode of nonvolatile memory element, in accordance with some embodiments. Nonvolatile memory element 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each nonvolatile memory element that has two resistance states may be used to store one bit of data. It should be noted that some nonvolatile memory elements may have three and even more resistance states allowing multi-bit storage in the same cell.

HRS and LRS are defined by presence or absence of one or more filaments or conduction paths in resistance switching layer 104 and forming connections between these filaments or conduction paths and two electrodes 102 and 106. For example, a nonvolatile memory element may be initially fabricated in LRS and then switched to HRS. A nonvolatile memory element may be switched back and forth between LRS and HRS many times, defined by set and reset cycles. Furthermore, a nonvolatile memory element may maintain its LRS or HRS for a substantial period of time and withstand a number of read cycles.

The overall operation of nonvolatile memory element 100 may be divided into a read operation, set operation (i.e., turning the cell "ON"), and reset operation (i.e., turning the cell "OFF"). During the read operation, the state of nonvolatile memory element 100 or, more specifically, the resistance of resistance switching layer 104 can be sensed by applying a sensing voltage to electrodes 102 and 106. The sensing voltage is sometimes referred to as a "READ" voltage and indicated as $V_{READ}$ in FIG. 2. If nonvolatile memory element 100 is in HRS represented by line 122, the external read and write circuitry connected to electrodes 102 and 106 will sense the resulting "OFF" current ($I_{OFF}$) that flows through nonvolatile memory element 100. As stated above, this read operation may be performed multiple times without switching nonvolatile memory element 100 between HRS and LRS. In the above example, the nonvolatile memory element 100 should continue to output the "OFF" current ($I_{OFF}$) when the read voltage ($V_{READ}$) is applied to the electrodes.

Continuing with the above example, when it is desired to switch nonvolatile memory element 100 into a different logic state (corresponding to LRS), nonvolatile memory element 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistance switching layer 104 and switches nonvolatile memory element 100 from its HRS to LRS as indicated by dashed line 126. It should be noted that formation or breaking of filaments or conduction paths in resistance switching layer 104 may also involve forming or breaking electrical connections between these filaments and one (e.g., reactive electrode) or both electrodes. The overarching concern is passage of the current between the two electrodes.

In LRS, the resistance characteristics of nonvolatile memory element 100 are represented by line 124. In this LRS, when the read voltage ($V_{READ}$) is applied to electrodes 102 and 106, the external read and write circuitry will sense the resulting "ON" current ($I_{ON}$) that flows through nonvolatile memory element 100. Again, this read operation may be performed multiple times without switching nonvolatile memory element 100 between LRS and HRS.

It may be desirable to switch nonvolatile memory element 100 into a different logic state again by switching nonvolatile memory element 100 from its LRS to HRS. This operation is referred to as a reset operation and should be distinguished from set operation during which nonvolatile memory element 100 is switched from its HRS to LRS. During the reset operation, a reset voltage ($V_{RESET}$) is applied to memory element 100 to break the previously formed filaments or conduction paths in resistance switching layer 104 and switches nonvolatile memory element 100 from its LRS to HRS as indicated by dashed line 128. Reading of nonvolatile memory element 100 in its HRS is described above. Overall, nonvolatile memory element 100 may be switched back and forth between its LRS and HRS many times. Read operations may be performed in each of these states (between the switching operations) one or more times or not performed at all. It should be noted that application of set and reset voltages to change resistance states of the nonvolatile memory element involves complex mechanisms that are believed to involve localized resistive heating as well as mobility of defects impacted by both temperature and applied potential.

Nonvolatile memory element 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistance switching layer 104. In the bipolar switching the set voltage ($V_{SET}$) and reset voltage ($V_{RESET}$) applied to resistance switching layer 104 need to have different polarities.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., a high $I_{SET}/I_{RESET}$ ratio) that correspond to set voltage ($V_{SET}$) and reset voltage ($V_{RESET}$) may be at least about 5 or, more specifically, at least about 10 to make the state of nonvolatile memory element easier to determine. Nonvolatile memory elements should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same nonvolatile memory element may include two or more resistance switching layers interconnected in series. Adjacent resistance switching layers may directly interface each other or be separated by an intermediate layer.

In some embodiments, a nonvolatile memory element is subjected to a forming operation, during which the initially insulating properties of the resistance switching layer are altered and the nonvolatile memory element is configured into the initial LRS or HRS. The forming operation may include a very short high discharge current peak associated with a forming voltage, which is used to set the LRS level of the resistance switching layer for subsequent switching as outlined above. In this case, a resistance switching layer with very low levels (e.g., 100-30 kOhm) of resistance in the LRS may be limited in terms of scaling down. This difficulty may be resolved by positioning such resistance switching layers in series with other components providing additional resistance to the overall nonvolatile memory element.

Processing Examples

Figure 3:
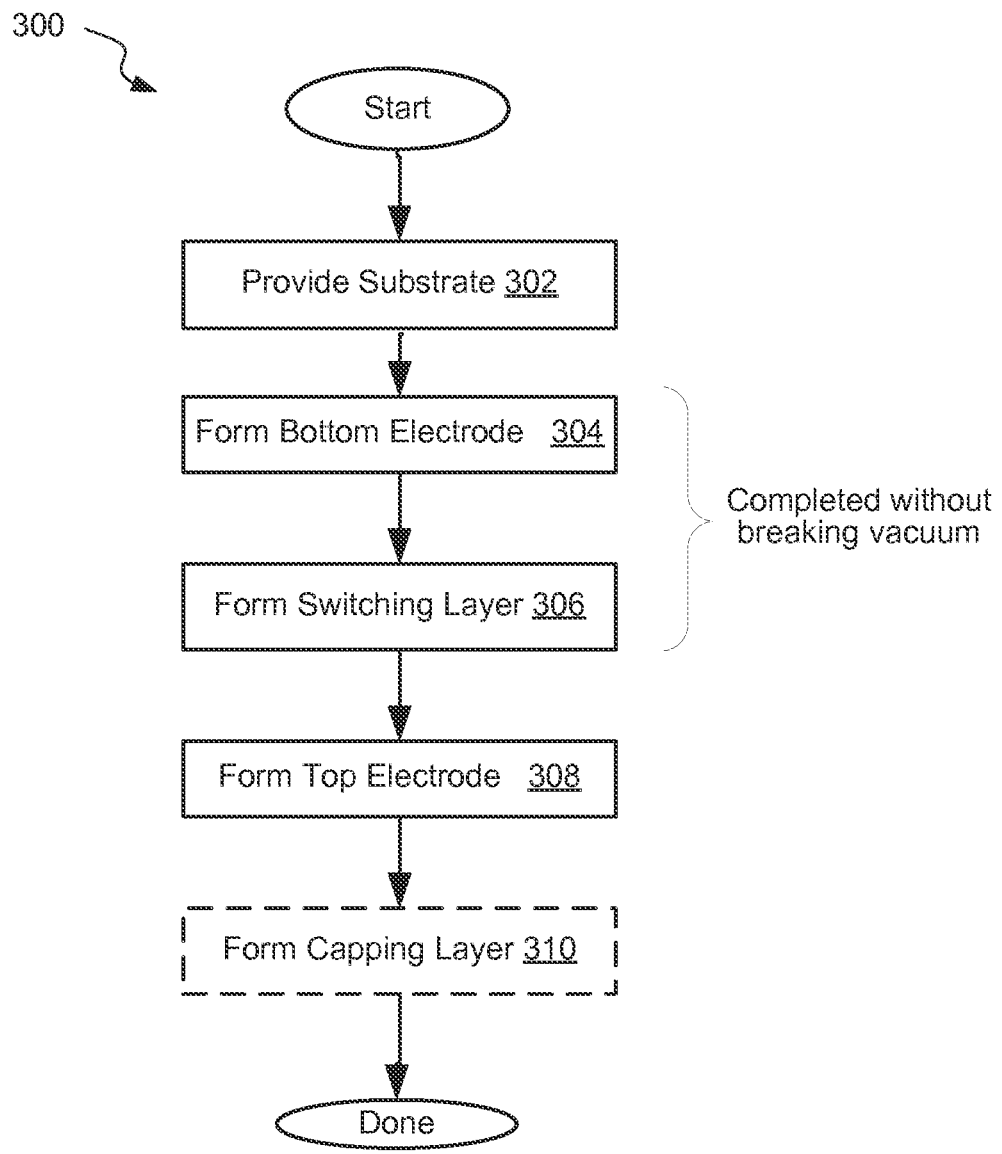
FIG. 3 illustrates a process flowchart corresponding to a method of forming a nonvolatile memory element using atomic layer deposition, in accordance with some embodiments.

FIG. 3 illustrates a process flowchart corresponding to method 300 of forming a nonvolatile memory element using ALD techniques, in accordance with some embodiments. Method 300 may commence with providing a substrate during operation 302. This substrate is used to deposit a bottom electrode and resistive switching layer in later operations. The substrate may include one or more signal lines or contacts, with which the bottom electrode will form an electrical connection during its deposition. The substrate may have a pre-treated surface suitable for ALD.

Method 300 may proceed with forming the bottom electrode using ALD during operation 304. This operation may involve one or more cycles, each involving the following four steps: introducing one or more precursors into the depositing chamber to form an absorbed layer, followed by purging these precursors reactive agents, and then introducing reactive agents that will react with the absorbed layer to form a portion of or the entire electrode layer, followed by purging the reactive agents reactive agents. Selection of precursors and processing conditions depend on desired composition, morphology, and structure of each portion of the electrode. These factors are further described below with reference to illustrative examples.

A layer formed during each ALD cycle described above may be between about 0.25 and 2 Angstroms thick. In some embodiments, this thickness may not be sufficient for an electrode. The cycle may be repeated multiple times to increase the electrode layer to the desired thickness. In some embodiments, the thickness of the electrode is less than 50 Angstroms or, more specifically, less than 30 Angstroms. The minimum electrode thickness is determined by the resistance of the metal layer. The requirement of the metal layer is to be continuous and have a sufficiently low resistance compared to the LRS of the switching layer. ALD can deposit a continuous film as low as 10 Angstroms thick that is still reasonable conductive. In some embodiment, electrodes formed from materials that intrinsically contain and capable to release oxygen (e.g., TiN) are formed into even thinner layers to reduce the total amount of oxygen for preventing unwanted oxidization of the switching layer or the interface. In some embodiments, ALD cycles are repeated using different precursors. As such, different portions of the same electrode layer may have different compositions. This approach may be used to deposit, for example, tertiary nitrides, in the form of nano-laminates.

A brief description of an ALD technique is presented below to provide better understanding of various processing features. In ALD, precursors are introduced into the deposition chamber and allowed to flow over the substrate surface provided therein. The precursors are introduced in the form of pulses. Between the pulses, the reaction chamber is purged, for example, with an inert gas to remove unreacted precursors, reaction products, and other undesirable components from the chamber.

When a precursor is provided above the substrate surface, the precursor may adsorb (e.g., saturatively chemisorb) at that surface. Subsequent pulsing with a purging gas removes excess precursor from the deposition chamber. In some embodiments, purging is performed before full saturation of the substrate surface occurs with the precursors. In other words, additional precursor molecules could have been further adsorbed on the substrate surface if the purging was not initiated so early. Without being restricted to any particular theory, it is believed that partial saturation can be used to introduced defects into the formed layer, e.g., during forming of a resistive switching layer. Partial saturation during ALD processing may be detected or, more generally, characterized using X-ray photoelectron spectroscopy (XPS). The partial saturation during ALD corresponds to metal rich resulting layers. For example, when hafnium oxide is deposited using ALD, its stoichiometric formula may be represented by $HfO_x$. When partial saturation is used, the value of x (in $HfO_x$) is less than 2, rather than equal to 2 for the full saturated case corresponding to so called stoichiometric oxides. Partial saturation techniques lead to non-stoichiometric oxides.

After the initial precursor pulsing and purging, a subsequent pulse introduces a reactant into the chamber and it reacts with the first precursor adsorbed to the surface (which is sometimes referred to as an intermediate processing layer) and forms a portion of the electrode, resistive switching layer, or other components. Reaction byproducts and excess reactants are purged from the deposition chamber. In ALD, the saturation during the reaction and purging stages makes the growth self-limiting. This feature helps to improve deposition uniformity and conformality and allows more precise control of the resulting resistive switching characteristics.

The precursors used in an ALD process may be gaseous, liquid, or solid. However, liquid or solid precursors should be sufficiently volatile to allow introduction as a gas. The vapor pressure should be high enough for effective mass transportation. Also, solid and some liquid precursors may need to be heated and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may somewhat vary during the process because of changes in their surface area.

Additional characteristics of ALD precursors involve thermal stability and adsorption. The precursors should be thermally stable at the substrate temperature because their decomposition would alter the surface control. A slight decomposition, if slow compared to the ALD growth, can be tolerated. The precursors should adsorb (e.g., chemisorb) on or react with the surface, though the interaction between the precursor and the surface as well as the mechanism for the adsorption is different for different precursors. The molecules at the substrate surface should react aggressively with the reactant to form the desired film. Additionally, precursors should not react with the film to cause etching, and precursors should not dissolve in the film.

ALD provides continuity at an interface avoiding poorly defined nucleating regions that are typical for chemical vapor deposition and physical vapor deposition. ALD also provides conformality over a variety of substrate topologies due to its layer-by-layer deposition technique, use of low temperature, mildly oxidizing processes, and lack of dependence on the reaction chamber geometry. As described above, the growth thickness in ALD depends mainly on the number of cycles performed and ability to form multilayer laminate films with resolution of one to two mono-layers.

In some embodiments, an electrode including titanium nitride is deposited using ALD. This operation may start with exposing the substrate surface to a titanium containing precursor, some examples of which include titanium chloride ($TiCl_4$), titanium iodine ($TiI_4$), bis(tert-butylcyclopentadienyl) titanium dichloride ($C_{18}H_{26}Cl_2Ti$), bis(diethylamido) bis(dimethylamido)titanium ($Ti(N(CH_3)_2)_2(N(CH_2CH_3)_2)_2$), tetrakis(diethylamido)titanium ($[(C_2H_5)_2N]_4Ti$), tetrakis(dimethylamido)titanium ($[(CH_3)_2N]_4Ti$), tetrakis (ethylmethylamido)titanium ($[(CH_3C_2H_5)N]_4Ti$), titanium diisopropoxidebis(2,2,6,6-tetramethyl-3,5-heptanedionate) ($Ti[OCC(CH_3)_3CHCOC(CH_3)_3]_2(OC_3H_7)_2$), and titanium isopropoxide ($Ti[OCH(CH_3)_2]_4$). Other titanium containing precursors can be used as well.

The temperature of the substrate during ALD may be between about 200° C. to 350° C. The precursor may be either in gaseous phase, liquid phase, or solid phase. If a liquid or solid precursor is used, then it may be transported into the chamber an inert carrier gas, such as helium or nitrogen. The titanium containing precursor pulse is generally performed to a full saturation as defects are generally not needed in electrodes.

After the titanium containing precursor pulse, the processing chamber is purged, and a nitrogen containing reactant is introduced into the chamber. The nitrogen containing reactant may include ammonia ($NH_3$), which in some embodiments may be mixed with carbon monoxide (CO). Furthermore, various nitrogen oxides (e.g., NO, $NO_2$) may be used as oxidizing agents and source of nitrogen and/or oxygen. The nitrogen containing reactant reacts with the titanium containing precursor adsorbed on the substrate surface and forms titanium nitride. This step is followed by another purging operation. A cycle may be repeated until a desired thickness of the electrode is formed. In subsequent cycles, the titanium containing precursor adsorbs on previously deposited titanium nitride sub-layers (portions) of the electrode.

In some embodiments, electrode may include tantalum nitride or tungsten nitride. Some example of tantalum containing precursors include pentakis (dimethylamino) tantalum ($Ta(N(CH_3)_2)_5$), tris(diethylamido) (tert-butylimido) tantalum (($CH_3)_3CNTa(N(C_2H_5)_2)_3$), tris(diethylamido) (ethylimido) tantalum ($C_2H_5NTa(N(C_2H_5)_2)_3$), tris(ethylmethylamido) (tert-butylimido) tantalum ($C_{13}H_{33}N_4Ta$). Examples of tungsten containing precursors include bis(butylcyclopentadienyl) tungsten diiodide ($C_{18}H_{26}I_2W$), bis (tert-butylimino)bis(tert-butylamino) tungsten (($C_4H_9NH)_2W(C_4H_9N)_2$), bis(tert-butylimino)bis(dimethylamino) tungsten ((($CH_3)_3CN)_2W(N(CH_3)_2)_2$), bis(cyclopentadienyl) tungstendichloride ($C_{10}H_{10}Cl_2W$), bis(cyclopentadienyl) tungsten dihydride ($C_{10}H_{12}W$), bis(isopropylcyclopentadienyl) tungsten dihydride (($C_5H_4CH(CH_3)_2)_2WH_2$), cyclopentadienyl tungsten tricarbonyl hydride ($C_8H_6O_3W$), tetracarbonyl(1,5-cyclooctadiene)tungsten ($C_{12}H_{12}O_4W$), triaminetungsten tricarbonyl (($NH_3)_3W(CO)_3$), tungsten hexacarbonyl ($W(CO)_6$).

Other metals suitable for electrodes in resistive switching memory cells include niobium, molybdenum, nickel, aluminum, platinum, ruthenium, and copper. An example of a niobium containing precursor includes bis(cyclopentadienyl) niobium dichloride ($C_{10}H_{10}Cl_2Nb$). Some examples of molybdenum containing precursors include bicyclo[2.2.1] hepta-2,5-diene) tetracarbonyl molybdenum ($C_{11}H_8MoO_4$), bis(cyclopentadienyl) molybdenum dichloride ($C_{10}H_{10}Cl_2Mo$), cyclopentadienyl molybdenum tricarbonyl ($C_{16}H_{10}Mo_2O_6$), molybdenum hexacarbonyl ($Mo(CO)_6$), (propylcyclopentadienyl) molybdenum tricarbonyl dimer ($C_{22}H_{22}Mo_2O_6$).

Examples of nickel containing precursors include bis(cyclopentadienyl) nickel ($Ni(C_5H_5)_2$), bis(ethylcyclopentadienyl) nickel ($Ni(C_5H_4C_2H_5)_2$), bis(triphenylphosphine) nickel dichloride ($[(C_6H_5)_3P]_2NiCl_2$), nickel bis(2,2,6,6-tetramethyl-3,5-heptanedionate) ($Ni(OCC(CH_3)_3CHCOC(CH_3)_3)_2$). Examples of aluminum containing precursors include aluminum tris(2,2,6,6-tetramethyl-3,5-heptanedionate) ($Al(OCC(CH_3)_3CHCOC(CH_3)_3)_3$), triisobutylaluminum ($[(CH_3)_2CHCH_2]_3Al$), trimethylaluminum (($CH_3)_3Al$), tris(dimethylamido) aluminum ($Al(N(CH_3)_2)_3$).

An example of a platinum containing precursor includes trimethyl (methylcyclopentadienyl) platinum ($C_5H_4CH_3Pt(CH_3)_3$). Some examples of ruthenium containing precursors include bis(cyclopentadienyl) ruthenium ($C_{10}H_{10}Ru$), bis (ethylcyclopentadienyl) ruthenium ($C_7H_9RuC_7H_9$), bis(pentamethylcyclopentadienyl) ruthenium ($Ru(C_5(CH_3)_5)_2$), triruthenium dodecacarbonyl ($Ru_3(CO)_{12}$). Copper containing electrodes may be deposited using copper bis(6,6,7,7,8,8,8-heptafluoro-2,2-dimethyl-3,5-octanedionate) ($Cu(OCC(CH_3)_3CHCOCF_2CF_2CF_3)_2$) or copper bis(2,2,6,6-tetramethyl-3,5-heptanedionate) ($Cu(OCC(CH_3)_3CHCOC(CH_3)_3)_2$).

Returning to FIG. 3, method 300 may proceed with forming a resistance switching layer during operation 306. In some embodiments, the resistance switching layer is formed in the same deposition chamber as the bottom electrode and without breaking vacuum in this chamber between operations 304 and 306. For purposes of this document, the term "without breaking vacuum" means maintaining the pressure in the deposition chamber within ranges used during operation 304 and 306 and preventing excessive oxygen concentrations (typically associated with ambient conditions) in the processing chamber during this period of time. The concern here is with oxidation of the bottom electrode prior to formation of the resistive switching layer.

Various materials may be suitable for resistive switching layers. Some examples include hafnium oxide, aluminum oxide, nickel oxide, zirconium oxide, tantalum oxide. Additional examples include oxides having certain level of defects, such as silicon oxide, titanium oxide, niobium oxide, copper oxide, tungsten oxide, cobalt oxide, cerium oxide, yttrium oxide, and ytterbium oxide. Furthermore, compound metal oxides, such as hafnium silicon oxide, hafnium silicon oxinitride, hafnium oxinitride, and aluminum oxinitride, may be used. The following description pertains to forming hafnium oxide layer. The operation may start with introducing a hafnium containing precursor into the chamber that has a substrate with the previously formed bottom electrode. Some examples of hafnium containing precursors include bis(tert-butylcyclopentadienyl) dimethyl hafnium ($C_{20}H_{32}Hf$), bis(methyl-η5-cyclopentadienyl) methoxymethyl hafnium ($HfCH_3(OCH_3)[C_5H_4(CH_3)]_2$), bis(trimethylsilyl) amido hafnium chloride ($[[(CH_3)_3Si]_2N]_2HfCl_2$), dimethylbis(cyclopentadienyl) hafnium (($C_5H_5)_2Hf(CH_3)_2$), hafnium isopropoxide isopropanol adduct ($C_{12}H_{28}HfO_4$), tetrakis(diethylamido) hafnium ($[(CH_2CH_3)_2N]_4Hf$), and tetrakis(ethylmethylamido) hafnium ($[(CH_3)(C_2H_5)N]_4Hf$). Some hafnium containing precursors can be represented with a formula (RR'N) 4Hf, where R and R' are independent hydrogen or alkyl groups and may be the same or different.

The hafnium containing precursor is introduced to the chamber as a pulse. A purge gas may be provided continuously with the pulse or may be discontinued during the pulse. The purge gas is non-reactive or inert at given process conditions and may include nitrogen ($N_2$) or helium (He). At least a portion of the hafnium containing precursor adsorbs onto or reacts with the surface of the bottom electrode. Adsorption of the hafnium containing precursor depends on the availability of adsorption sites. When these sites are all consumed (i.e., a fully saturated processing layer is formed), no more hafnium precursor can adsorb, and any remaining precursor is removed by flowing the purge gas. In some embodiments, the hafnium containing precursor or other precursor used to form a resistive switching layer is not allowed to fully saturate prior to purging and introducing a reactive agent. This partial saturation feature is used to introduce defects into the resistive switching layer. The defects may be needed to provide resistive switching characteristics to the layer.

Following the hafnium containing precursor pulse and purge, a pulse of an oxidizing agent is provided to the deposition chamber. Some examples of suitable oxidizing agents include water ($H_2O$), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), alcohols (e.g., ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds (eg., O, $O_2$, $O_3$, and OH radicals produced by heat, hot-wires, and/or plasma). The oxidizing agent reacts with the hafnium containing precursor remaining on the substrate and forms a hafnium oxide film. The oxidizing agent is purged from the deposition chamber. This cycle may be repeated until the desired thickness of hafnium oxide is formed. Resistive switching layers having different composition (e.g., aluminum oxide) may be deposited in a similar manner.

After depositing the resistive switching layer during operation 306, the substrate containing the bottom electrode and resistive switching layer may be removed from the deposition chamber and exposed to an oxidizing environment (e.g., the ambient environment). In other words, vacuum may be broken in the deposition chamber without a substantial risk of oxidizing the bottom electrode. At this point, the process may continue with depositing a top electrode during operation 308 and, optionally, deposition of a capping layer during operation 310. The top electrode may also be deposited using ALD techniques described above to ensure the desired thickness and composition of this electrode. If the top electrode is also formed from an oxygen sensitive material, then the capping layer may be deposited over this electrode in the same processing chamber without breaking vacuum between depositions of the top electrode and the capping layer. In some embodiments, a signal line serves the function of the capping layer.

Figure 4:
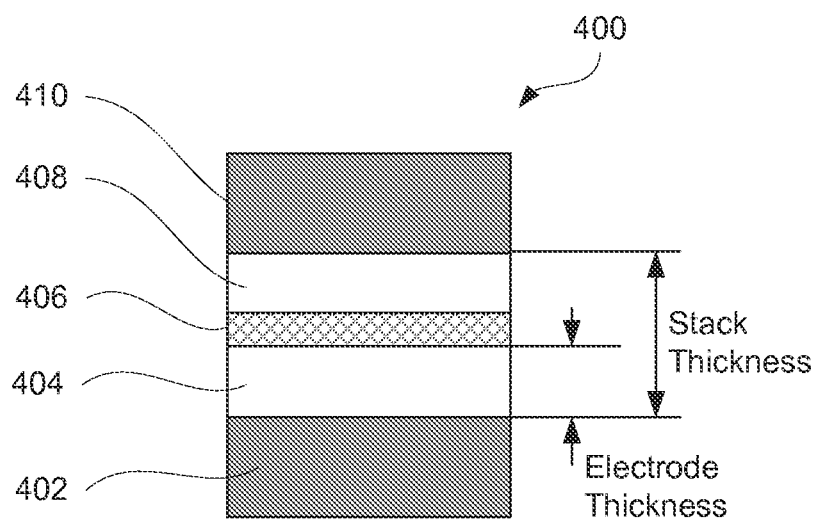
FIG. 4 illustrates a schematic representation of a memory element fabricated in accordance with operations illustrated in FIG. 3, in accordance with some embodiments.

FIG. 4 illustrates a schematic representation of resistive switching memory element 400 fabricated in accordance with operations described above with reference to FIG. 3. Resistive switching memory element 400 includes base layer 402, which may function as a signal line, protective layer, or other type of layer. In some embodiments, the protective layer on the bottom serves the same purpose as a capping layer on the top. Base layer 402 provides a surface for deposition of bottom electrode 404 and prevents oxygen and other contaminants from reaching bottom electrode 404, at least the bottom side of bottom electrode 404. Bottom electrode 404 is disposed between base layer 402 and resistive switching layer 406. Top electrode 408 is provided above resistive switching layer 406 and may be covered by top layer 410. Top layer 410 may be a signal line, capping layer, or other type of layer.

In some embodiments, bottom electrode 404 and/or top electrode 408, each has a thickness of less than 50 Angstroms or, more specifically, less than 30 Angstroms. These thickness ranges may be achieved in a controllable manner using ALD techniques described above. Furthermore, in some embodiments, the thickness of the stack including both electrodes 404 and 408 as well as resistive switching layer 406 is less than 300 Angstroms or, more specifically, less than 100 Angstroms.

Apparatus Examples

Figure 5:
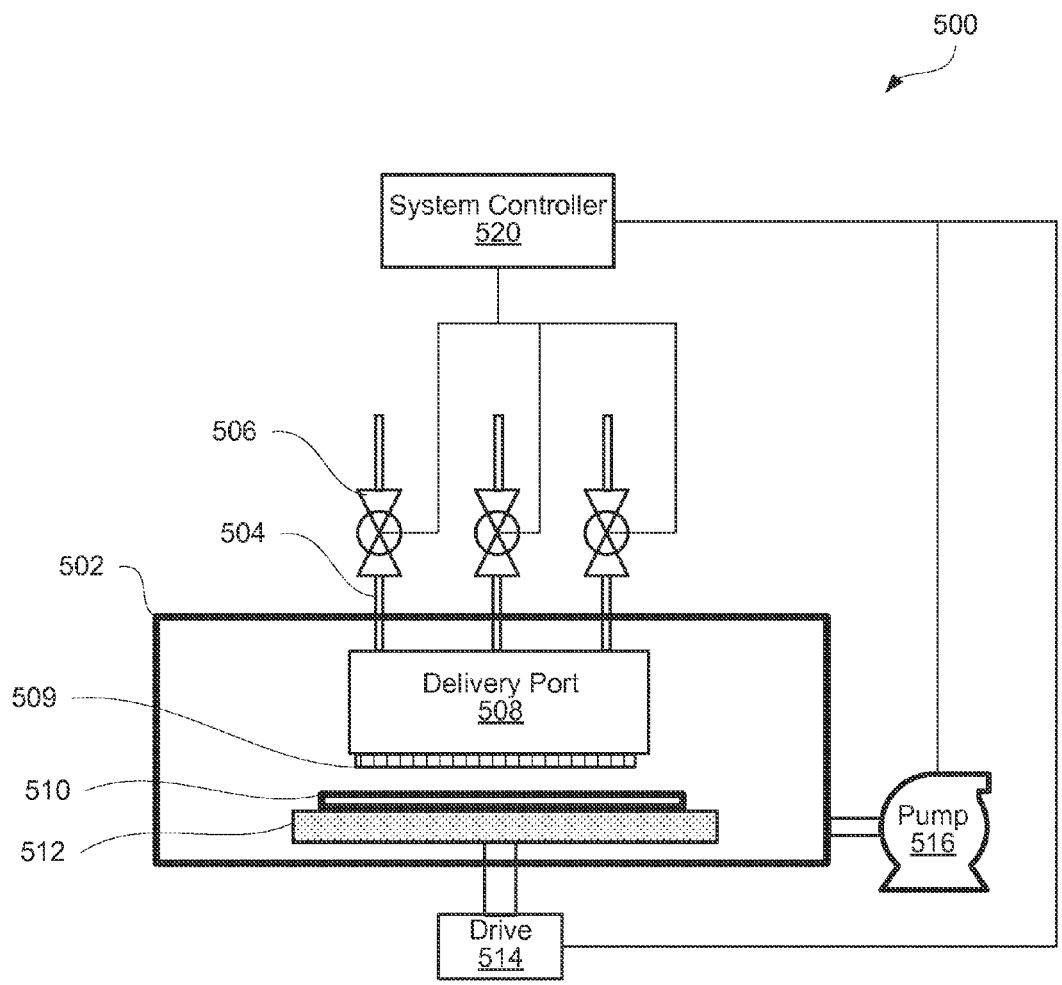
FIG. 5 illustrates a schematic representation of a atomic layer deposition apparatus for fabricating nonvolatile memory elements, in accordance with some embodiments.

FIG. 5 illustrates a schematic representation of ALD apparatus 500 for fabricating nonvolatile memory elements, in accordance with some embodiments. For clarity, some components of apparatus 500 are not included in this figure, such as a wafer-loading port, wafer lift pins, and electrical feed throughs. Apparatus 500 includes deposition chamber 502 connected to processing gas delivery lines 504. While FIG. 5 illustrates three delivery lines 504, any number of delivery lines may be used. Each line may be equipped with a valve and/or mass flow controller 506 for controlling the delivery rates of processing gases into deposition chamber 502. In some embodiments, gases are provided into delivery port 508 prior to exposing substrate 510 to processing gases. Deliver port 508 may be used for premixing gases (e.g., precursors and diluents) and even distribution of gases over the surface of substrate 510. Delivery port 508 is sometimes referred to as a showerhead. Delivery port 508 may include a diffusion plate 509 having with multiple holes for gas distribution.

Deposition chamber 502 encloses substrate support 512 for holding substrate 510 during its processing. Substrate support 512 may be made from a thermally conducting metal (e.g., W, Mo, Al, Ni), conductive ceramics, or other like materials and may be used to maintain the substrate temperature at desired levels. Substrate support 512 may be connected to drive 514 for moving substrate 510 during loading, unloading, process set up, and sometimes even during processing. Deposition chamber 502 may be connected to vacuum pump 516 for evacuating reaction products and unreacted gases from deposition chamber 502 and for maintaining the desirable pressure inside chamber 502.

Apparatus 500 may include system controller 520 for controlling process conditions during electrode and resistive switching layer deposition and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments.

Memory Array Examples

Figure 6A:
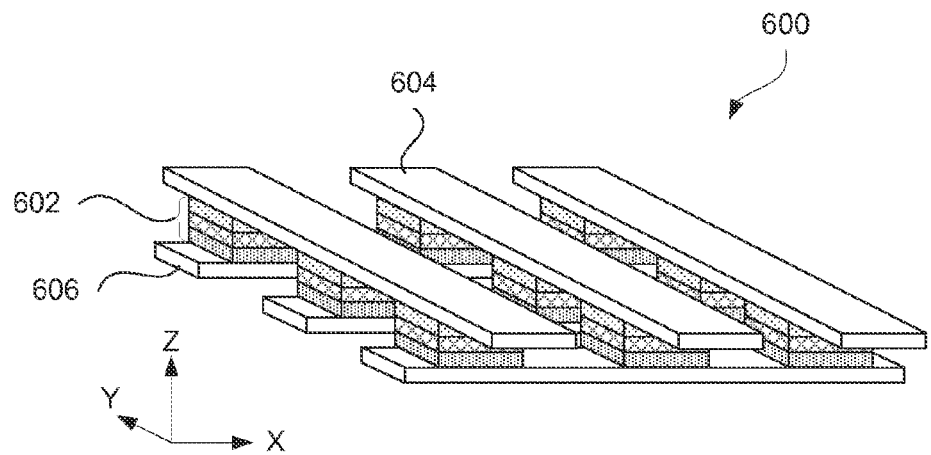
FIGS. 6A and 6B illustrate schematic views of memory arrays including multiple nonvolatile memory elements, in accordance with some embodiments.

A brief description of memory arrays will now be described with reference to FIGS. 6A and 6B to provide better understanding to various aspects of thermally isolating structures provided adjacent to nonvolatile memory elements and, in some examples, surrounding the nonvolatile memory elements. Nonvolatile memory elements described above may be used in memory devices or larger integrated circuits (IC) that may take a form of arrays. FIG. 6A illustrates a memory array 600 including nine nonvolatile memory elements 602, in accordance with some embodiments. In general, any number of nonvolatile memory elements may be arranged into one array. Connections to each nonvolatile memory element 602 are provided by signal lines 604 and 606, which may be arranged orthogonally to each other. Nonvolatile memory elements 602 are positioned at crossings of signal lines 604 and 606 that typically define boundaries of each nonvolatile memory element in array 600.

Signal lines 604 and 606 are sometimes referred to as word lines and bit lines. These lines are used to read and write data into each nonvolatile memory element 602 of array 600 by individually connecting nonvolatile memory elements to read and write controllers. Individual nonvolatile memory elements 602 or groups of nonvolatile memory elements 602 can be addressed by using appropriate sets of signal lines 604 and 606. Each nonvolatile memory element 602 typically includes multiple layers, such as top and bottom electrodes, resistance switching layer, embedded resistors, embedded current steering elements, and the like, some of which are further described elsewhere in this document. In some embodiments, a nonvolatile memory element includes multiple resistance switching layers provided in between a crossing pair of signal lines 604 and 606.

As stated above, various read and write controllers may be used to control operations of nonvolatile memory elements 602. A suitable controller is connected to nonvolatile memory elements 602 by signal lines 604 and 606 and may be a part of the same memory device and circuitry. In some embodiments, a read and write controller is a separate memory device capable of controlling multiple memory devices each one containing an array of nonvolatile memory elements. Any suitable read and write controller and array layout scheme may be used to construct a memory device from multiple nonvolatile memory elements. In some embodiments, other electrical components may be associated with the overall array 600 or each nonvolatile memory element 602. For example, to avoid the parasitic-path-problem, i.e., signal bypasses by nonvolatile memory elements in their low resistance state (LRS), serial elements with a particular non-linearity must be added at each node or, more specifically, into each element. Depending on the switching scheme of the nonvolatile memory element, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
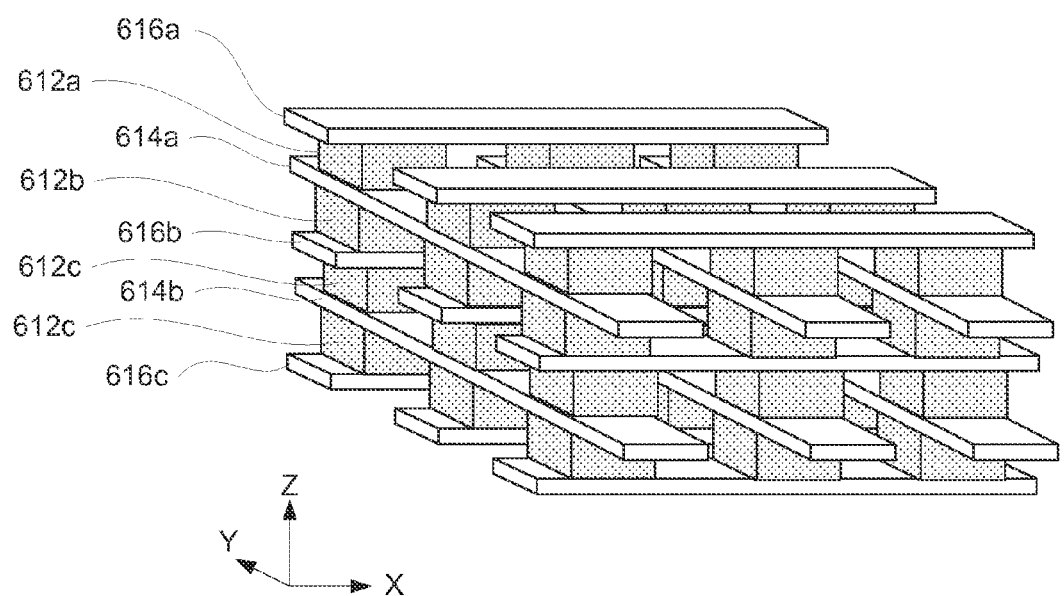

In some embodiments, a memory device may include multiple array layers as, for example, illustrated in FIG. 6B. In this example, five sets of signal lines 614*a-b* and 616*a-c* are shared by four ReRAM arrays 612*a-c*. As with the previous example, each ReRAM array is supported by two sets of signal lines, e.g., array 612*a* is supported by 614*a* and 616*a*. However, middle signal lines 614*a-b* and 616*b*, each is shared by two sets ReRAM arrays. For example, signal line set 614*a* provides connections to arrays 612*a* and 612*b*. Top and bottom sets of signal lines 616*a* and 616*c* are only used for making electrical connections to one array. This 3-D arrangement of the memory device should be distinguished from various 3-D arrangements in each individual nonvolatile memory element.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of forming a nonvolatile memory element, the method comprising:

forming a first layer using atomic layer deposition in a first processing chamber, the first layer being operable as a first electrode;

forming a second layer using atomic layer deposition in the first processing chamber, the second layer being operable as a resistive switching layer; and annealing the substrate after the forming of the second layer, the annealing resulting in oxygen transferring from the second layer and into the first layer;

wherein the second layer is formed over the first layer without breaking vacuum in the first processing chamber between forming the first layer and forming the second layer.

2. The method of claim 1, wherein the first layer is formed over a signal line, and wherein the signal line and the second layer protect the first layer from oxidation.

3. The method of claim 1, wherein the first layer comprises one or more of tantalum nitride, titanium nitride, or tungsten nitride.

4. The method of claim 1, wherein the first layer has a thickness of less than 50 Angstroms.

5. The method of claim 1, further comprising:

forming a third layer using atomic layer deposition in a second processing chamber, the third layer being operable as a second electrode and being formed over the second layer; and forming a fourth layer over the third layer without breaking vacuum in the second processing chamber between forming the third layer and forming the fourth layer, and wherein the second layer and the fourth layer protect the third layer from oxidation.

6. The method of claim 5, wherein the fourth layer is operable as a signal line.

7. The method of claim 5, wherein a combined thickness of the first layer, the second layer, and the third layer is less than about 300 Angstroms.

8. The method of claim 5, wherein the first processing chamber is different from the second processing chamber, and wherein the second layer is exposed to an ambient environment prior to forming the third layer.

9. The method of claim 5, wherein the first processing chamber is the same as the second processing chamber, and wherein forming the third layer over the second layer is performed without breaking vacuum in the processing chamber between forming the second layer and forming the third layer.

10. The method of claim 5, wherein a composition of the third layer is the same as a composition of the first layer.

11. The method of claim 5, wherein the fourth layer comprises copper.

12. The method of claim 1, wherein forming the first layer comprises delivering one or more of tantalum containing precursor, titanium containing precursor, or tungsten containing precursor into the first processing chamber.

13. The method of claim 1, wherein forming the second layer comprises:

introducing a first precursor into the first processing chamber, wherein a portion of the first precursor forms a first adsorbed layer on the first layer;

purging the first precursor from the first processing chamber; and introducing one or more of an oxygen containing reactive agent and a nitrogen containing reactive agent into the first processing chamber to convert the first adsorbed layer into the second layer.

14. The method of claim 13, wherein the first precursor comprises one or more of a hafnium containing precursor or an aluminum containing precursor.

15. The method of claim 13, wherein the oxygen containing reactive agent comprises one or more of water, isopropyl alcohol, oxygen, or ozone.

16. The method of claim 13, wherein the first layer has a coverage of less than one mono-layer.

17. The method of claim 1, wherein the first layer directly interfaces the second layer.

18. A method of forming a nonvolatile memory element, the method comprising:

forming a first layer using atomic layer deposition in a processing chamber, the first layer operable as a first electrode and comprising one of tantalum nitride, titanium nitride, or tungsten nitride; and forming a second layer using atomic layer deposition in the processing chamber, the second layer operable as a resistive switching layer and comprising one of hafnium oxide or aluminum oxide, wherein the second layer is formed directly over the first layer without breaking vacuum in the processing chamber between forming the first layer and forming the second layer, and wherein forming the second layer comprises:

introducing a first precursor into the first processing chamber, wherein a portion of the first precursor forms a first adsorbed layer on the first layer;

purging the first precursor from the first processing chamber; and introducing one or more of an oxygen containing reactive agent and a nitrogen containing reactive agent into the first processing chamber to convert the first adsorbed layer into the second layer.

19. A nonvolatile memory element comprising:

a first layer operable as a first electrode and formed using atomic layer, the first layer being free of oxygen; and a second layer operable as a resistive switching layer and directly interfacing the first layer, the second layer formed using atomic layer deposition, wherein the second layer has a thickness of less than 50 Angstroms.

* * * * *